United States Patent
Li et al.

(10) Patent No.: US 6,756,180 B2
(45) Date of Patent: Jun. 29, 2004

(54) CYCLIC OLEFIN-BASED RESIST COMPOSITIONS HAVING IMPROVED IMAGE STABILITY

(75) Inventors: Wenjie Li, Poughkeepsie, NY (US); Pushkara Rao Varanasi, Poughkeepsie, NY (US); Masafumi Yamamoto, Yokkaichi (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/278,178

(22) Filed: Oct. 22, 2002

(65) Prior Publication Data

US 2004/0076903 A1 Apr. 22, 2004

(51) Int. Cl.$^7$ ............................................. G03F 7/004
(52) U.S. Cl. ..................... 430/270.1; 430/326; 430/907
(58) Field of Search ............................. 430/326, 270.1, 430/907

(56) References Cited

U.S. PATENT DOCUMENTS

| | | | |
|---|---|---|---|
| 4,855,017 A | | 8/1989 | Douglas |
| 5,362,663 A | | 11/1994 | Bronner et al. |
| 5,399,647 A | * | 3/1995 | Nozaki |
| 5,429,710 A | | 7/1995 | Akiba et al. |
| 5,468,819 A | * | 11/1995 | Goodall et al. |
| 5,562,801 A | | 10/1996 | Nulty |
| 5,585,219 A | * | 12/1996 | Kaimoto et al. |
| 5,618,751 A | | 4/1997 | Golden et al. |
| 5,705,503 A | * | 1/1998 | Goodall et al. |
| 5,738,975 A | * | 4/1998 | Nakano et al. |
| 5,744,376 A | | 4/1998 | Chan et al. |
| 5,750,680 A | * | 5/1998 | Kim et al. |
| 5,770,346 A | * | 6/1998 | Iwasa et al. |
| 5,776,657 A | * | 7/1998 | Schaedeli et al. |
| 5,801,094 A | | 9/1998 | Yew et al. |
| 5,821,469 A | | 10/1998 | Shanmugham |
| 5,830,965 A | * | 11/1998 | Imaizumi et al. |
| 5,837,419 A | * | 11/1998 | Ushirogouchi et al. |
| 5,843,624 A | * | 12/1998 | Houlihan et al. |
| 6,048,664 A | | 4/2000 | Houlihan et al. |
| 6,063,542 A | | 5/2000 | Hyeon et al. |
| 6,103,445 A | | 8/2000 | Wilson et al. |
| 6,136,499 A | | 10/2000 | Goodall et al. |
| 6,146,810 A | | 11/2000 | Seo et al. |
| 6,159,655 A | | 12/2000 | Sato |
| 6,232,417 B1 | | 5/2001 | Rhodes et al. |
| 6,251,560 B1 | | 6/2001 | Wallow et al. |
| 6,268,106 B1 | | 7/2001 | Park et al. |
| 6,329,125 B2 | | 12/2001 | Takechi et al. |
| 6,358,666 B1 | | 3/2002 | Seo et al. |
| 6,369,143 B1 | | 4/2002 | Park et al. |
| 6,436,606 B1 | | 8/2002 | Hatakeyama et al. |
| 6,451,499 B1 | | 9/2002 | Jayaraman et al. |
| 6,451,945 B1 | | 9/2002 | Jayaraman et al. |

FOREIGN PATENT DOCUMENTS

EP        0 880 074 A1  *  11/1998

* cited by examiner

*Primary Examiner*—Rosemary Ashton
(74) *Attorney, Agent, or Firm*—Steven Capella

(57) ABSTRACT

Acid-catalyzed positive resist compositions which are imageable with 193 nm radiation (and possibly other radiation) and are developable to form resist structures of improved development characteristics, improved etch resistance, and reduced post-exposure bake sensitivity are enabled by the use of resist compositions containing an imaging polymer having cyclic olefin monomeric units respectively having pendant, acid-labile protecting moieties, lactone moieties and fluoroalcohol moieties. The lactone moiety is preferably a pendant lactone ester.

18 Claims, No Drawings

CYCLIC OLEFIN-BASED RESIST COMPOSITIONS HAVING IMPROVED IMAGE STABILITY

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

The ability to produce smaller devices is limited by the ability of lithographic techniques to reliably resolve smaller features and spacings. The nature of optics is such that the ability to obtain finer resolution is limited in part by the wavelength of light (or other radiation) used to create the lithographic pattern. Thus, there has been a continual trend toward use of shorter light wavelengths for lithographic processes. Recently, the trend has been to move from so-called I-line radiation (350 nm) to 248 nm radiation.

For future reductions in size, the need to use 193 nm radiation appears likely. Unfortunately, resist compositions at the heart of current 248 nm lithographic processes are typically unsuitable for use at shorter wavelengths.

While a resist composition must possess desirable optical characteristics to enable image resolution at a desired radiation wavelength, the resist composition must also possess suitable chemical and mechanical properties to enable transfer to the image from the patterned resist to an underlying substrate layer(s). Thus, a patternwise exposed positive resist must be capable of appropriate dissolution response (i.e. selective dissolution of exposed areas) to yield the desired resist structure. Given the extensive experience in the lithographic arts with the use of aqueous alkaline developers, it is important to achieve appropriate dissolution behavior in such commonly used developer solutions.

The patterned resist structure (after development) must be sufficiently resistant to enable transfer of the pattern to the underlying layer(s). Typically, pattern transfer is performed by some form of wet chemical etching or ion etching. The ability of the patterned resist layer to withstand the pattern transfer etch process (i.e., the etch resistance of the resist layer) is an important characteristic of the resist composition.

While some resist compositions have been designed for use with 193 nm radiation, these compositions have generally failed to deliver the true resolution benefit of shorter wavelength imaging due to a lack of performance in one or more of the above mentioned areas. For example, there is a desire for resist compositions exhibiting improved development characteristics (e.g., resolution, development speed, contrast, shrinkage, etc.), improved etch resistance, and improved lithographic process window. There is especially a desire for resist compositions having improved image stability and reduced sensitivity to fluctuations in post-exposure bake.

SUMMARY OF THE INVENTION

The invention provides resist compositions which are capable of high resolution lithographic performance using 193 nm imaging radiation (and possibly also with other imaging radiation). The resist compositions of the invention possess an improved combination of improved development characteristics, improved etch resistance, and/or reduced post-exposure bake sensitivity needed to provide pattern transfer at very high resolutions which are limited only by the wavelength of imaging radiation.

The invention also provides lithographic methods using the resist compositions of the invention to create resist structures and methods using the resist structures to transfer patterns to an underlying layer(s). The lithographic methods of the invention are preferably characterized by the use of 193 nm ultraviolet radiation patternwise exposure.

In one aspect, the invention encompasses a resist composition comprising:
  (a) an acid-sensitive imaging polymer, and
  (b) a radiation-sensitive acid generator, the imaging polymer comprising:
    i) cyclic olefin monomeric units each having a pendant acid-labile moiety that inhibits solubility in aqueous alkaline solutions,
    ii) cyclic olefin monomeric units each having a pendant lactone moiety, and
    iii) cyclic olefin monomeric units each having a pendant fluoroalcohol moiety.

The lactone moiety is preferably present as a pendant lactone ester.

In another aspect, the invention encompasses a method of forming a patterned material structure on a substrate, the method comprising:
  (A) providing a substrate with a layer of the material,
  (B) applying a resist composition to the substrate to form a resist layer on the substrate, the resist composition comprising (a) an imaging polymer, and (b) a radiation sensitive acid generator, the imaging polymer comprising monomer units having a group pendant from a polymerizing portion of the monomer, the pendant group containing a remote acid-labile moiety;
  (C) patternwise exposing said substrate to radiation whereby acid is generated by said acid generator in exposed regions of said resist layer by said radiation,
  (D) contacting said substrate with an aqueous alkaline developer solution, whereby said exposed regions of said resist layer are selectively dissolved by said developer solution to reveal a patterned resist structure, and
  (E) transferring resist structure pattern to said material layer, by etching into said material layer through spaces in said resist structure pattern.

Preferably, the radiation used in step (B) in the above method is 193 nm ultraviolet radiation. The material to be patterned is preferably selected from the group consisting of organic dielectrics, semiconductors, metals, and ceramics.

These and other aspects of the invention are discussed in further detail below.

DETAILED DESCRIPTION OF THE INVENTION

The invention provides resist compositions which are capable of high resolution lithographic performance with (a) image stability/developability, (b) improved etch resistance, and/or (c) reduced sensitivity to fluctuations in post-exposure bake. The resists of the invention are preferably imageable using 193 nm imaging radiation (and possibly also with other imaging radiation). The resist compositions of the invention are characterized by the presence of an imaging polymer having cyclic olefin monomeric units respectively having pendant, acid-labile protecting moieties, lactone moieties and fluoroalcohol moieties.

The invention also provides lithographic methods using the resist compositions of the invention to create resist structures and methods using the resist structures to transfer patterns to an underlying layer(s). The lithographic methods of the invention are preferably characterized by the use of 193 nm ultraviolet radiation patternwise exposure.

The resist compositions of the invention generally comprise:

(a) an acid-sensitive imaging polymer, and
(b) a radiation-sensitive acid generator, the imaging polymer comprising:
  i) cyclic olefin monomeric units each having a pendant acid-labile moiety that inhibits solubility in aqueous alkaline solutions,
  ii) cyclic olefin monomeric units each having a pendant lactone moiety, and
  iii) cyclic olefin monomeric units each having a pendant fluoroalcohol moiety.

Cyclic olefin monomeric units i) may be any cyclic olefin monomeric unit having an acid labile moiety that inhibit solubility in aqueous alkaline solutions. Examples of cyclic olefin monomers include the monomer illustrated below where at least one of $R_1$ to $R_4$ comprises an acid-labile protecting moiety, the other groups $R_1$ to $R_4$ (not containing an acid labile moiety) are preferably independently selected from hydrogen and linear or branched $C_1$–$C_{10}$ alkyls, and n is zero or a positive integer, preferably n is 0 or 1:

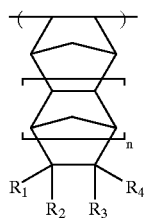

Preferred acid-labile protecting moieties are selected are selected from the group consisting of tertiary alkyl (or cycloalkyl) esters (e.g., t-butyl, methyl cyclopentyl, methyl cyclohexyl, methyl adamantyl), ester ketals, and ester acetals. Methyl cyclopentyl ester is a most preferred acid-labile protecting moiety. If desired, combinations of cyclic olefin units i) having differing protecting acid labile moieties may be used.

Cyclic olefin monomeric units ii) may be any cyclic olefin monomeric unit having a pendant lactone moiety. Examples of cyclic olefin monomers include the monomer illustrated below where at least one of $R_5$ to $R_8$ comprises a lactone moiety, the other groups $R_5$ to $R_8$ (not containing a lactone moiety) are preferably independently selected from hydrogen and linear or branched $C_1$–$C_{10}$ alkyls, and n is zero or a positive integer, preferably n is 0 or 1:

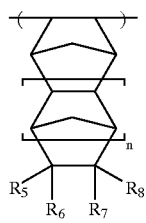

The lactone moiety is preferably present as a lactone ester, for example, see the monomer shown below:

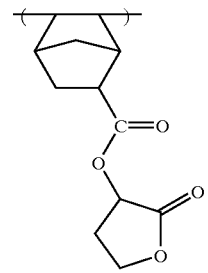

The invention is not limited to any specific lactone ring size. Preferably, the lactone moiety comprises a 5 to 7 member lactone ring.

Cyclic olefin monomeric units iii) may be any cyclic olefin monomeric unit having a pendant fluoroalcohol moiety. Examples of cyclic olefin monomers include the monomer illustrated below where at least one of $R_9$ to $R_{12}$ comprises a fluoroalcohol moiety, the other groups $R_9$ to $R_{12}$ (not containing a fluoroalcohol moiety) are preferably independently selected from hydrogen and linear or ranched $C_1$–$C_{10}$ alkyls, and n is zero or a positive integer, preferably n is 0 or 1:

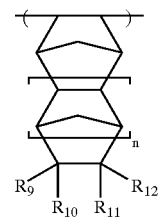

The fluoroalcohol moiety preferably has a $pK_a$ of about 13 or less, more preferably about 10 or less. The fluoroalcohol moiety is preferably a $C_1$–$C_{10}$ fluoroalcohol, more preferably a $C_1$–$C_3$ fluoroalcohol, most preferably a $C_3$ fluoroalcohol. Some examples of possible fluoroalcohols are hexafluoroisopropanol, trifluoroisopropanol, and trifluoroethanol. If desired, combinations of cyclic olefin units iii) having differing fluoroalcohol moieties may be used.

For lithographic applications used in the manufacture of integrated circuit structures and other microscopic structures, the imaging polymers of invention preferably comprise at least about 15 mole % of cyclic olefin monomeric units i), more preferably about 20–80 mole %, most preferably about 30–60 mole %. The imaging polymers of the invention preferably contain at least about 5 mole % of cyclic olefin monomeric units ii), more preferably about 10–70 mole %, most preferably about 20–40 mole %. The imaging polymer preferably contains about 5–80 mole % of cyclic olefin monomeric units iii), more preferably about 20–40 mole %. The imaging polymer preferably consists essentially of cyclic olefin monomeric units i), ii) and iii). The cyclic olefin polymers of the invention preferably contain sufficient monomer i) such that the unexposed polymer itself is substantially insoluble in aqueous alkaline developers commonly used in lithographic applications.

In addition to the cyclic olefin polymers, the resist compositions of the invention contain a radiation-sensitive acid generator (PAG). The invention is not limited to the use of any specific acid generator or combination of acid generators, that is the benefits of the invention may be achieved using various radiation-sensitive acid generators known in the art. Preferred PAG's are those which contain reduced amounts (or preferably zero) aryl moieties. Where aryl-containing acid generator is employed, the absorptive characteristics of the acid generator at 193 nm may restrict the amount of acid generator that can be included in the formulation.

Examples of suitable radiation-sensitive acid generators include (but preferably with alkyl substituted for one or more of any indicated aryl moieties) onium salts such as triaryl sulfonium hexafluoroantimonate, diaryliodonium, hexafluoroantimonate, hexafluoroarsenates, triflates, perfluoroalkane sulfonates (e.g., perfluoromethane sulfonate, perfluorobutane, perfluorohexane sulfonate, perfluorooctane sulfonate etc.), substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), α–α'bis-sulfonyl diazomethanes, naphthoquinone-4-diazides, alkyl disulfones and others.

The resist compositions of the invention will typically contain a solvent prior to their application to the desired substrate. The solvent may be any solvent conventionally used with acid-catalyzed resists which otherwise does not have any excessively adverse impact on the performance of the resist composition. Preferred solvents are propylene glycol monomethyl ether acetate and cyclohexanone.

The compositions of the invention may further contain minor amounts of auxiliary components such as bulky hydrophobic additives, dyes/sensitizers, base additives, etc. as are known in the art. Preferred base additives are weak bases which scavenge trace acids while not having an excessive impact on the performance of the resist. Preferred base additives are (aliphatic or alicyclic) tertiary alkyl amines, aromatic amines, or t-alkyl ammonium hydroxides such as t-butyl ammonium hydroxide (TBAH).

The resist compositions of the invention preferably contain about 0.5–20 wt. % (more preferably about 3–15 wt. %) radiation-sensitive acid generator based on the total weight of cyclic olefin polymer in the composition. Where a solvent is present, the overall composition preferably contains about 50–90 wt. % solvent. The composition preferably contains about 1 wt. % or less of said base additive based on the total weight of acid sensitive polymer.

The lactone cyclic olefin monomers and other monomers used in the present invention may be synthesized by known techniques and are generally commercially available. The invention is not limited to any specific method of synthesizing the cyclic olefin polymers used in the invention. Preferably, the cyclic olefin polymers are formed by addition polymerization. Examples of suitable techniques are disclosed in U.S. Pat. Nos. 5,468,819 and 5,705,503 assigned to B.F. Goodrich Company, the disclosures of which are incorporated herein by reference. The cyclic olefin polymers of the invention preferably have a weight average molecular weight of about 5,000–100,000, more preferably about 10,000–50,000.

The resist compositions of the invention can be prepared by combining the cyclic olefin polymer, acid generator, and any other desired ingredients using conventional methods. The resist composition to be used in lithographic processes will generally have a significant amount of solvent.

The resist compositions of the invention are especially useful for lithographic processes used in the manufacture of integrated circuits on semiconductor substrates. The compositions are especially useful for lithographic processes using 193 nm UV radiation. Where use of other radiation (e.g. mid-UV, 248 nm deep UV, x-ray, or e-beam) is desired, the compositions of the invention can be adjusted (if necessary) by the addition of an appropriate dye or sensitizer to the composition. The general use of the resist compositions of the invention in lithography for semiconductors is described below.

Semiconductor lithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. In many instances, an antireflective coating (ARC) is applied over the material layer before application of the resist layer. The ARC layer may be any conventional ARC which is compatible with acid catalyzed resists.

Typically, the solvent-containing resist composition is applied to the desired semiconductor substrate using spin coating or other technique. The substrate with the resist coating is then preferably heated (pre-exposure baked) to remove the solvent and improve the coherence of the resist layer. The thickness of the applied layer is preferably as thin as possible with the provisos that the thickness is preferably substantially uniform and that the resist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the resist. Preferably, the pre-exposure bake is performed at temperatures which are at least 20° C. below $T_g$.

After solvent removal, the resist layer is then patternwise-exposed to the desired radiation (e.g. 193 nm ultraviolet radiation). Where scanning particle beams such as electron beam are used, patternwise exposure may be achieved by scanning the beam across the substrate and selectively applying the beam in the desired pattern. More typically, where wavelike radiation forms such as 193 nm ultraviolet radiation, the patternwise exposure is conducted through a mask which is placed over the resist layer. For 193 nm UV radiation, the total exposure energy is preferably about 100 millijoules/cm$^2$ or less, more preferably about 50 millijoules/cm$^2$ or less (e.g. 15–30 millijoules/cm$^2$).

After the desired patternwise exposure, the resist layer is typically baked to further complete the acid-catalyzed reaction and to enhance the contrast of the exposed pattern. The post-exposure bake is preferably conducted at about 100–175° C., more preferably about 125–160° C. The post-exposure bake is preferably conducted for about 30 seconds to 5 minutes.

After post-exposure bake, the resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. Preferably, the resist compositions of the invention can be developed with conventional 0.26N aqueous alkaline solutions. The resist compositions of the invention can also be developed using 0.14N or 0.21N or other aqueous alkaline solutions. The resulting resist structure on the substrate is then typically dried to remove any remaining developer solvent. The resist compositions of the invention are generally characterized in that the product resist structures have high etch resistance. In some instances, it may be possible to further enhance the etch resistance of the resist structure by using a post-silylation technique using methods known in the art. The compositions of the invention enable the reproduction of lithographic features The pattern from the resist structure may then be transferred to the material (e.g., organic dielectric, ceramic, metal or semiconductor) of the underlying substrate. Typically, the transfer is achieved by reactive ion etching or some other etching technique. In the context of reactive ion etching, the etch resistance of the resist layer is especially important. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (organic dielectric, ceramic, metal or semiconductor) features generally involve providing a material layer or section of the substrate to be patterned, applying a layer of resist over the material layer or section, patternwise exposing the resist to radiation, developing the pattern by contacting the exposed resist with a solvent, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; and 5,821,469, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

EXAMPLE 1

A terpolymer containing approximately 45 mol % norbornene carboxylic acid methylcyclopentyl ester, 25 mol % norbornene carboxylic acid γ-butyrolactone ester, and 30 mol % norbornene α,α-bis(trifluoromethyl) ethanol was prepared by addition polymerization.

EXAMPLE 2

A terpolymer containing approximately 40 mol % norbornene carboxylic acid methylcyclopentyl ester, 30 mol % norbornene carboxylic acid γ-butyrolactone ester, and 30 mol % norbornene α,α-bis(trifluoromethyl) ethanol was prepared by addition polymerization.

EXAMPLE 3

For the purpose of lithographic experiments, a resist formulation containing the polymer described in Example 1 was prepared by combining the materials set forth below, expressed in part by weight.

| | |
|---|---|
| Propylene glycol methyl ether acetate (PGMEA) | 89 |
| Norbornene terpolymer (Example 1) | 9.88 |
| Di-t-butylphenyliodonium perfluorooctanesulfonate | 0.4 |
| perfluorobutylsulfonyloxybicyclo [2.2.1]-hept-5-ene-2,3-dicarboximide | 0.69 |
| 1-t-butyloxycarbonyl 2-phenylbenzimidazole | 0.03 |
| T-butyloxycarbonyl dicyclohexyl amine | 0.01 |

Following filtration through a 0.2 μm Teflon® (PTFE) membrane, the resist formulation was spin-coated (for 30 seconds) onto antireflective material (AR19, Shipley Company) layer-coated silicon wafers. The resist layer was soft-baked at 130° C. for 60 seconds on a vacuum hot plate to produce a film of about 0.34 μm thickness. The wafers were then exposed to 193 nm radiation (ASML scanner, 0.75 NA). The exposure pattern was an array of lines and spaces of varying dimensions down to 0.1 μm. The exposed wafers were post-exposure baked on a vacuum hot plate at 130° C. for 90 seconds. The wafers were then (puddle) developed using 0.263 N tetramethyl ammonium hydroxide developer for 60 seconds. The patterns were examined by scanning electron microscopy (SEM). Line/space pairs of 113 nm and above were well resolved.

EXAMPLE 4

A resist formulation containing the polymer described in Example 2 was prepared by combining the materials set forth below, expressed in part by weight.

| | |
|---|---|
| Propylene glycol methyl ether acetate (PGMEA) | 89 |
| Norbornene terpolymer (Example 2) | 9.84 |
| Di-t-butylphenyliodonium perfluorooctanesulfonate | 0.3 |
| perfluorobutylsulfonyloxybicyclo [2.2.1]-hept-5-ene-2,3 dicarboximide | 0.84 |
| 1-t-butyloxycarbonyl 2-phenylbenzimidazole | 0.03 |

Following filtration through a 0.2 μm Teflon® (PTFE) membrane, the resist formulation was spin-coated (for 30 seconds) onto antireflective material (AR19, Shipley Company) layer-coated silicon wafers. The resist layer was soft-baked at 130° C. for 60 seconds on a vacuum hot plate to produce a film of about 0.3 μm thickness. The wafers were then exposed to 193 nm radiation (ASML scanner, 0.75 NA). The exposure pattern was an array of contact hole patterns of varying dimensions. The exposed wafers were post-exposure baked on a vacuum hot plate at 130° C. for 90 seconds. The wafers were then (puddle) developed using 0.263 N tetramethyl ammonium hydroxide developer for 60 seconds. The patterns were examined by scanning electron microscopy (SEM). Contact holes of 90 nm and above were well resolved.

What is claimed is:

1. A resist composition comprising (a) an acid-sensitive imaging polymer, and (b) a radiation-sensitive acid generator, said imaging polymer comprising:
   i) cyclic olefin monomeric units each having a pendant acid-labile moiety that inhabits solubility in aqueous alkaline solutions,
   ii) cyclic olefin monomeric units each having a pendant lactone moiety, wherein said lactone moiety is part of a lactone ester moiety pendant from said cyclic olefin monomeric units ii), and
   iii) cyclic olefin monomeric units each having a pendant fluoroalcohol moiety.

2. The resist composition of claim 1 wherein said fluoroalcohol moiety is selected from the group consisting of hexafluoroisopropanol, trifluoroisopropanol and trifluoroethanol.

3. The resist composition of claim 1 wherein said lactone moiety of said cyclic olefin monomeric units ii) Is selected from the group consisting of 5-member ring lactones, 6-member ring lactones and 7-member ring lactones.

4. The resist composition of claim 1 wherein said cyclic olefin monomeric units i) contain an acid-labile protecting group containing a moiety selected from the group consisting of tertiary alkyl esters, cycloalkyl esters, ester ketals, and ester acetals.

5. The resist composition of claim 1 wherein said imaging polymer contains about 15–80 mole % of cyclic olefin monomeric units i).

6. The resist composition of claim 1 wherein said imaging polymer contains about 5–80 mole % of cyclic olefin monomeric units ii).

7. The resist composition of claim 1 wherein said imaging polymer contains about 5–80 mole % of cyclic olefin monomeric units iii).

8. The resist composition of claim 1 wherein said composition contains at least about 0.5 wt. % of said radiation-sensitive acid generator based on the weight of said imaging polymer.

9. A method of forming a patterned material structure on a substrate, said method comprising:
  (A) providing a substrate with a layer of said material,
  (B) applying a resist composition to said substrate to form a resist layer on said substrate, said resist composition comprising (a) an acid-sensitive imaging polymer, and (b) a radiation-sensitive acid generator, said imaging polymer comprising:
    i) cyclic olefin monomeric units each having a pendant acid-labile moiety that inhibits solubility in aqueous alkaline solutions,
    ii) cyclic olefin monomeric units each having a pendant lactone moiety, wherein said factone moiety is part of a lactone ester moiety pendant from said cyclic olefin monomeric units ii), and
    iii) cyclic olefin monomeric units each having a pendant fluroalcohol moiety,
  (C) patternwise exposing said substrate to radiation whereby acid is generated by said radiation-sensitive acid generator in exposed regions of said resist layer by said radiation,
  (D) contacting said substrate with an aqueous alkaline developer solution, whereby said exposed regions of said resist layer are selectively dissolved by said developer solution to reveal a patterned resist structure, and
  (E) transferring resist structure pattern to said material layer, by etching into said material layer through spaces in said resist structure pattern.

10. The method of claim 9 wherein said material is selected from the group consisting of organic dielectrics, metals, ceramics, and semiconductors.

11. The method of claim 9 wherein said fluoroalcohol moiety is selected from the group consisting of hexafluoroisopropanol, trifluoroisopropanol, and trifluoroethanol.

12. The method of claim 9 wherein said lactone moiety of said cyclic olefin monomeric units ii) is selected from the group consisting of 5-member ring lactones, 6-member ring lactones and 7-member ring lactones.

13. The method of claim 9 wherein said cyclic olefin monomeric units i) contain an acid-labile protecting group containing a moiety selected from the group consisting of tertiary alkyl esters, cycloalkyl esters, ester ketals, and ester acetals.

14. The method of claim 9 wherein said imaging polymer contains about 15–80 mole % of cyclic olefin monomeric units i), about 5–80 mole % of cyclic olefin monomeric units ii), and about 5–80 mole % of cyclic olefin monomeric units iii).

15. The method of claim 9 wherein said etching comprises reactive ion etching.

16. The method of claim 9 wherein at least one intermediate layer is provided between said material layer and said resist layer, and step (E) comprises etching through said intermediate layer.

17. The method of claim 9 wherein said radiation has a wavelength of about 193 nm.

18. The method of claim 9 wherein said substrate is baked between steps (C) and (D).

* * * * *

UNITED STATES PATENT AND TRADEMARK OFFICE
CERTIFICATE OF CORRECTION

PATENT NO. : 6,756,180 B2
DATED : June 29, 2004
INVENTOR(S) : Wenjie Li et al.

It is certified that error appears in the above-identified patent and that said Letters Patent is hereby corrected as shown below:

<u>Title page,</u>
Item [73], Assignee, after "International Business Machines Corporation, Armonk, NY (US)" insert -- JSR Corporation, Tokyo, Japan (JP) --.

Signed and Sealed this

Seventh Day of February, 2006

JON W. DUDAS
*Director of the United States Patent and Trademark Office*